United States Patent [19]
Tashiro

[11] Patent Number: 6,002,624
[45] Date of Patent: Dec. 14, 1999

[54] SEMICONDUCTOR MEMORY DEVICE WITH INPUT/OUTPUT MASKING FUNCTION WITHOUT DESTRUCTION OF DATA BIT

[75] Inventor: Shinya Tashiro, Kanagawa, Japan

[73] Assignee: NEC Corporation, Tokyo, Japan

[21] Appl. No.: 09/098,376

[22] Filed: Jun. 17, 1998

[30] Foreign Application Priority Data

Jun. 18, 1997 [JP] Japan .................................. 9-160707

[51] Int. Cl.$^6$ .................................................. G11C 7/00
[52] U.S. Cl. ...................................... 365/203; 365/189.11
[58] Field of Search .............................. 365/203, 189.09, 365/189.11, 208

[56] References Cited

U.S. PATENT DOCUMENTS 5,357,474  10/1994  Matano et al. ........................ 365/203
5,790,466  8/1998  Hotta ..................................... 365/203

*Primary Examiner*—David Neims
*Assistant Examiner*—Connie C. Yoha
*Attorney, Agent, or Firm*—Foley & Lardner

[57] ABSTRACT

A semiconductor synchronous dynamic random access memory device has an input/output masking function in a block write mode, plural bit line pairs are concurrently connected to a pair of data lines charged to a power voltage level by a precharge circuit in the input/output masking function so as to prevent memory cells from current flowing out from differential amplifiers, and the precharge circuit has not only p-channel type charging transistors but also n-channel enhancement type charging transistors; even if the bit line pairs are connected to the pair of data lines, the n-channel enhancement type charging transistors supplement the current through the data line pair to the bit line pairs, and prevent potential differences on the bit line pairs from undesirable destruction.

5 Claims, 4 Drawing Sheets

SEMICONDUCTOR MEMORY DEVICE WITH INPUT/OUTPUT MASKING FUNCTION WITHOUT DESTRUCTION OF DATA BIT

FIELD OF THE INVENTION

This invention relates to a semiconductor memory device and, more particularly, to a semiconductor synchronous memory device with an input/output masking function.

DESCRIPTION OF THE RELATED ART

A typical example of the semiconductor synchronous dynamic random access memory device is illustrated in FIG. 1 of the drawings. The prior art semiconductor synchronous dynamic random access memory device comprises a memory cell array 1, a sense amplifier unit 2, a selector 3, a write control circuit 4 and a precharge circuit 5. The memory cell array 1 includes plural memory cells 1a... and 1n, and each memory cells 1a to 1n is implemented by a series combination of a storage capacitor 1c and an n-channel enhancement type field effect transistor 1d. The memory cells 1a to 1n are selectively connected to bit line pairs BL1/BL1B to BLn/BLnB. Word lines WL are selectively connected to the gate electrodes of the n-channel enhancement type field effect transistors 1d, and a driving signal ΦWL on the selected word line causes the associated n-channel enhancement type field effect transistors 1d to turn on.

The sense amplifier unit 2 includes plural differential amplifiers 2a to 2n, and the differential amplifiers 2a to 2n are associated with the bit line pairs BL1/BL1B to BLn/BLnB, respectively. Namely, each differential amplifier 2a/2n has a series combination of a p-channel enhancement type field effect transistor Qp1 and an n-channel enhancement type field effect transistor Qn1 connected between a high voltage line 2b and a low voltage line 2c and another series combination of a p-channel enhancement type field effect transistor Qp2 and an n-channel enhancement type field effect transistor Qn2 also connected between the high voltage line 2b and the low voltage line 2c. The common drain node N1 of the first series combination is connected to the bit line BL1/BLn, and is further connected to the gate electrode of the p-channel enhancement type field effect transistor Qp2 and the gate electrode of the n-channel enhancement type field effect transistor Qn2. On the other hand, the common drain node N2 of the other series combination is connected to the bit line BL1B/BLnB, and is further connected to the gate electrode of the p-channel enhancement type field effect transistor Qp1 and the gate electrode of the n-channel enhancement type field effect transistor Qn1. When the differential amplifier 2a/2n is powered with a high voltage signal ΦSP and a low voltage signal ΦSN, the differential amplifier 2a/2n increases the magnitude of the potential difference between the common drain nodes N1 and N2 and, accordingly, between the bit lines BL1/BLn and BL1B/BLnB.

The selector 3 is connected between the bit line pairs BL1/BL1B to BLn/BLnB and a pair of data bus lines IOBT/IOBN. The selector 3 includes pairs of n-channel enhancement type field effect transistors Qn11/Qn12 to Qnn1/Qnn2. The pairs of n-channel Enhancement type field effect transistors Qn11/Qn12 to Qnn1/Qnn2 are connected between the bit line pairs BL1/BL1B to BLn/BLnB and the pair of cata lines IOBT/IOBN, and selecting signals Φ1 to Φn are respectively supplied to the gate electrodes of the pairs of n-channel enhancement type field effect transistors Qn11/Qn12 to Qnn1/Qnn2. Though not shown in FIG. 1, a controller selectively changes the selecting signals Φ1 to Φn to active high level in a standard read-out operation, and the associated bit line pair is connected through the pair of n-channel enhancement type field effect transistors Qn11/Qn12 ... or Qnn1/Qnn2 to the data bus lines IOBT/IOBN. The controller concurrently changes the selecting signals Φ1 to Φn to the active high level in an input/output masking function so as to concurrently connect the bit line pairs BL1/BL1B to BLn/BLnB to the data line pair IOBT/IOBN as will be described in detail herein-later.

The write control circuit 4 includes a pair of clocked inverters 4a/4b and an inverter 4c connected to the clocked inverter 4b, and the clocked inverter 4a and the inverter 4c are connected to the data bus lines IOBT/IOBN, respectively. A data signal ∠D is supplied to the input nodes of the clocked inverters 4a/4b, and a timing signal ΦW is supplied to the clock nodes of the clocked inverters 4a/4b. The clocked inverters 4a/4b produces the complementary data signal in synchronism with the timing signal ΦW, and the inverter 4c restores the data signal. Thus, the write control circuit 4 complementarily drives the data bus lines IOBT/IOBN depending upon the logic level of the data signal ΦD.

The precharging circuit 5 has a pair of p-channel enhancement type field effect transistors Qp3/Qp4, and the p-channel enhancement type field effect transistors Qp3/Qp4 are connected between a high voltage line Vp and the data bus lines IOBT/IOBN. A precharge control signal ΦP is supplied to the gate electrodes of the p-channel enhancement type field effect transistors Qp3/Qp4, and the p-channel enhancement type field effect transistors Qp3/Qp4 charge the data bus lines IOBT/IOBN to the precharge level Vp in the presence of the precharge control signal ΦP of the active low level.

The prior art semiconductor synchronous dynamic random access memory device has a block write mode, and a write-in data bit is supplied from the data bus lines IOBT/IOBN to the bit line pairs BL1/BL1B to BLn/BLnB in the block write mode. The block write operation requires an input/output masking function as follows.

FIG. 2 illustrates the input/output masking function in the block write mode. In FIG. 2, "Vdd" and "GND" mean a power voltage level and the ground level, respectively, and "BLn/BLnB", "2n" and "Qnn1/Qnn2" are assumed to represent plural bit line pairs, plural differential amplifiers and plural pairs of n-channel enhancement type field effect transistors, respectively.

The activation signals ΦSP/ΦSN, the bit line pairs BL1/BL1B to BLn1/BLnB are equalized at Vdd/2 in T1, and the data bus lines IOBT/IOBN are charged to Vdd. The timing signal ΦW, the data signal ΦD and the driving signal ΦWL are maintained at the ground level.

When the data read-out proceeds from T1 to T2, the driving signal ΦWL is changed to Vdd, and causes the n-channel enhancement type field effect transistors 1d of the associated memory cells 1a to 1n to turn on. Then, the associated storage capacitors 1c are connected to the bit line BL1 and the bit lines BLn, and potential differences take place on the bit line pair BL1/BL1B and the bit line pairs BLn/BLnB.

The activation signal ΦSP and the activation signal ΦSN are separated from Vdd/2 to Vdd and GND, and activate the differential amplifier 2a and the differential amplifiers 2n. The differential amplifier 2a and the differential amplifiers 2n increase the potential difference on the bit line pair BL1/BL1B and the potential differences on the bit line pairs BLn/BLnB.

The differential amplification is completed in T3. The bit line BL1 and the bit line BL1B reach GND and Vdd, respectively. On the other hand, the bit lines BLn and the bit lines BLnB reach Vdd and GND, respectively. Thus, the potential difference on the bit line pair BL1/BL1B is opposite in polarity to the potential differences or the bit line pairs BLn/BLnB.

When the data read-out proceeds to T4, all the selecting signals Φ1 to Φn are changed to Vdd. In order to achieve the input/output masking function, the timing signal ΦW, the data signal ΦD and the precharge control signal ΦP are maintained in GND, and the p-channel enhancement type field effect transistors Qp3/Qp4 keep the data bus lines IOBT/IOBN at Vdd. The data bus lines IOBT/IOBN charged to Vdd prevent the memory cells 1a to 1n from current flowing out from the differential amplifiers 2a to 2n as follows. GND on the bit lines BL1 and BLnB allow the n-channel enhancement type field effect transistor Qn11 and the n-channel enhancement type field effect transistors Qnn2 to turn on.

Although the p-channel enhancement type field effect transistor Qp4 supplies Vdd to the data bus line IOBN, the plural n-channel enhancement type field effect transistors Qn2 of the differential amplifiers 2n pull down the data bus line IOBN to GND. Accordingly, the n-channel enhancement type field effect transistor Qn12 turns on, and the n-channel enhancement type field effect transistors Qn2 of the differential amplifiers 2n pull down the potential level on the bit line BL1B in spite of the current supplied through the p-channel enhancement type field effect transistor Qp4 and the p-channel enhancement type field effect transistor Qp2 of the differential amplifier 2a. On the other hand, the p-channel enhancement type field effect transistor Qp3 pulls up the bit line BL1 in spite of the n-channel enhancement type field effect transistor Qn1 of the differential amplifier 2a, and the p-channel enhancement type field effect transistors Qp1 of the differential amplifiers 2n supplement current to the data bus line IOBT upon decay of the potential level on the data bus line IOBT. As a result, the bit line BL1 rises toward a positive level lower than Vdd by the threshold Vthn of the n-channel enhancement type field effect transistor Qn11.

The data bus line BLn is maintained at Vdd. The p-channel enhancement type field effect transistor Qp4 supplies current through the data bus line IOBN and the n-channel enhancement type field effect transistor Qnn2 to the bit lines BLnB, and the bit lines BLnB rise to the certain level lower than Vdd by the threshold Vthn of the n-channel enhancement type field effect transistor Qnn2. Thus, the current flows between the precharge circuit 5 and the differential amplifiers 2a to 2n, and the memory cells 1a to 1n are free from the interference between the read-out data bits on the data bus lines IOBT/IOBN.

When the data read-out proceeds to T5, the selecting signals Φ1 to Φn are changed to GND, and the n-channel enhancement type field effect transistors Qn11/Qn12 to Qn1/Qnn2 turn off. The p-channel enhancement type field effect transistors Qp3/Qp4 charge the data bus lines IOBT/IOBN to Vdd. The bit line BL1/BL1B and the bit line pairs BLn/BLnB are recovered to the initial potential differences.

When the data read-out proceeds to T6, the driving signal ΦWL is changed to the low level, and the n-channel enhancement type field effect transistors 1d turn off. Thus, even though all the n-channel enhancement type field effect transistors Qn11/Qn12 to Qnn1/Qnn2 are turned on, the precharge circuit 5 pulls the data bus lines IOBT/IOBN to Vdd, and the precharge circuit 5 and the sense amplifier 2 prevent the memory cells 1a to 1n from undesirable data destruction through the input/output masking function.

However, the prior art semiconductor synchronous dynamic random access memory device encounters a problem in that the potential fall on the data bus line destroys a data bit to be restored in a memory cell. In detail, if the data bit on the bit line pair BL1/BL1B is opposite in logic level to the data bits on the bit line pairs BLn/BLnB as described hereinbefore, the data bus line IOBN is discharged through the n-channel enhancement type field effect transistor Qnn2 and the plural n-channel enhancement type field effect transistors Qn2 to the ground line 2c. When the data bus line IOBN reaches the certain potential level lower than the positive power voltage level Vdd by the threshold of the n-channel enhancement type field effect transistor Qn12, the n-channel enhancement type field effect transistor Qn12 turns on, and causes the bit line BL1B fall from the positive high voltage level Vdd. As a result, the potential difference between the bit line BL1 and the bit line B11B is decreased, and the data bit on the bit line pair BL1/BL1B is destroyed.

Another problem is unstable precharge level. This is because of the fact that the current driving capability is difference between the n-channel enhancement type field effect transistor Qn11, the n-channel enhancement type field effect transistors Qnn1, the n-channel enhancement type field effect transistors Qn1/Qn2 of the single differential amplifier 2a, the p-channel enhancement type field effect transistors Qp1/Qp2 of the single differential amplifier 2a, the n-channel enhancement type field effect transistors Qn1/Qn2 of the plural differential amplifiers 2n, the p-channel enhancement type field effect transistors Qp1/Qp2 of the plural differential amplifiers 2n due to the difference of the process parameters.

SUMMARY OF THE INVENTION

It is therefore an important object of the present invention to provide a semiconductor synchronous memory device, which achieves a highly reliable input/output masking function without data destruction.

It is also an important object of the present invention to provide a semi-conductor synchronous memory device, which creates stable precharge level on data bus lines without fluctuation of process parameters.

To accomplish the object, the present invention proposes to pull up data bus lines to a certain level lower than the power voltage level by the threshold of second charging transistors.

In accordance with one aspect of the present invention, there is provided a semiconductor memory device comprising a plurality of memory cells for storing data bits, a plurality of bit line pairs selectively connected to the plurality of memory cells and propagating potential differences representative of the data bits from the plurality of memory cells, a plurality of differential amplifiers connected between a first power voltage line and a second power voltage line different in potential level from the first power voltage line and activated for increasing, the magnitude of the potential differences on the plurality of bit line pairs, a data line pair, a selector connected between the plurality of bit line pairs and the data line pair and responsive to selecting signals for concurrently connecting the plurality of bit line pairs to the data line pair in a masking function and a precharge circuit connected to the data line pair and including first charging transistors connected between a third power voltage line and the data lines of tile data line pair and responsive to a precharge control signal so as to form first conductive channels of one conductivity type for charging the data lines to a power voltage on the third power voltage line and second charging transistors connected between the third power voltage line and the data lines and responsive to a complementary signal of the precharge control signal so as to form second conductive channels of the opposite conductivity type for charging the data lines to a certain level lower than the third power voltage line by a threshold of the second charging transistors.

BRIEF DESCRIPTION OF THE DRAWINGS

The features and advantages of the semiconductor synchronous memory device will be more clearly understood from the following description taken in conjunction with the accompanying drawings in which.

DESCRIPTION OF THE PREFERRED EMBODIMENT

Figure 1:
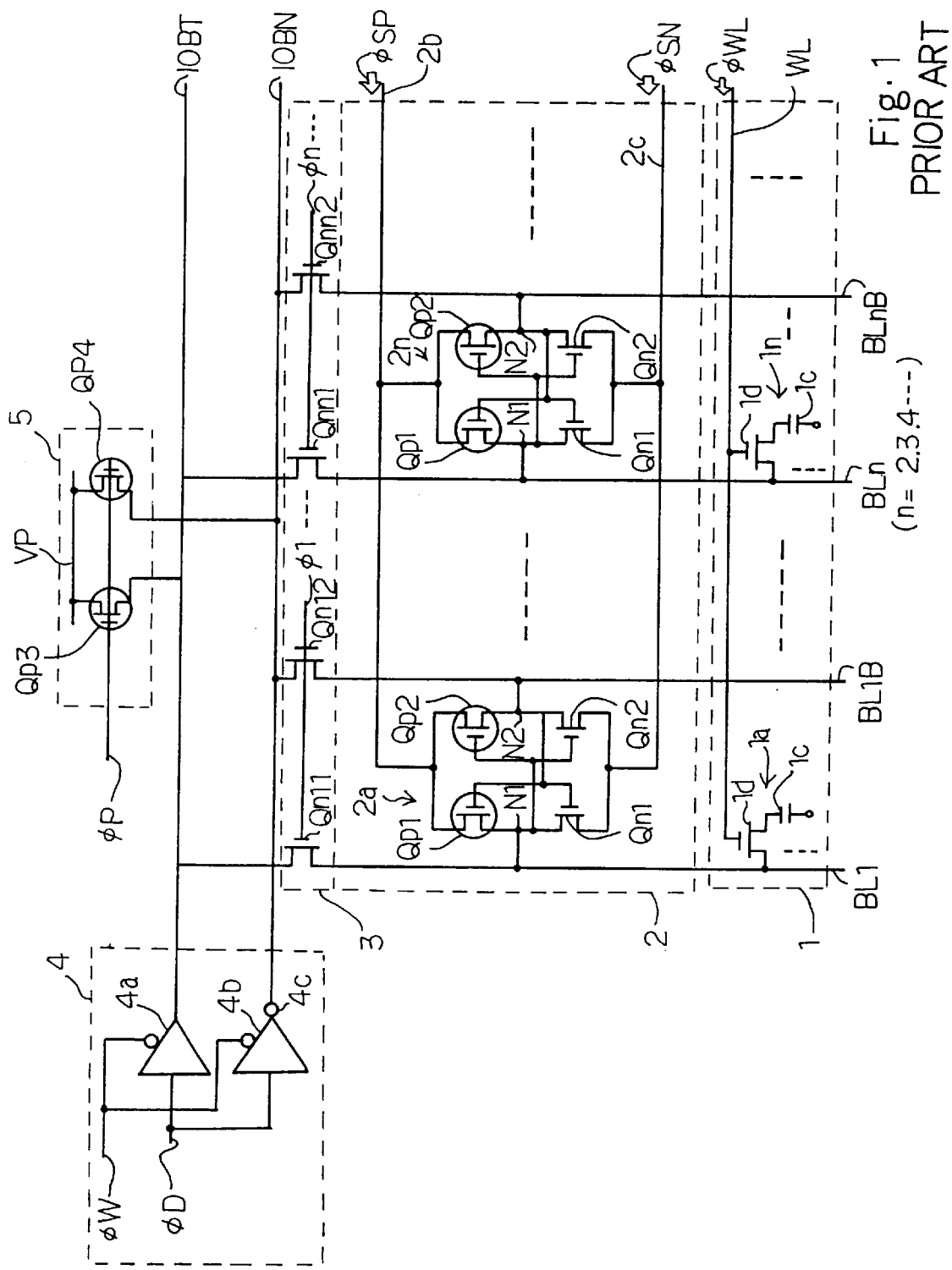
FIG. 1 is a circuit diagram showing the arrangement of the prior art semiconductor synchronous dynamic random access memory device.
Figure 2:
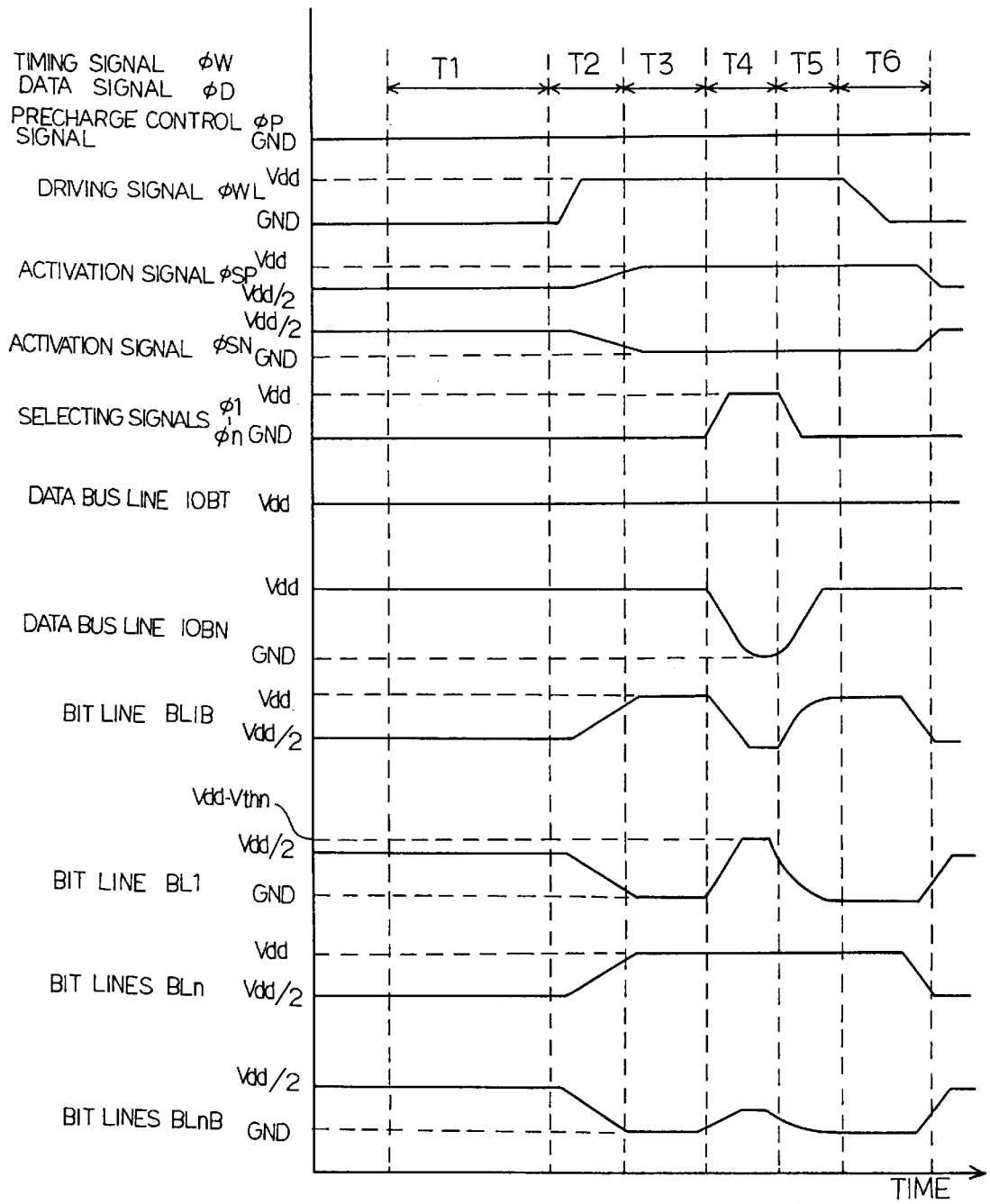
FIG. 2 is a timing chart showing an input/output masking function of the prior art semiconductor synchronous dynamic random access memory device in the block right mode.
Figure 3:
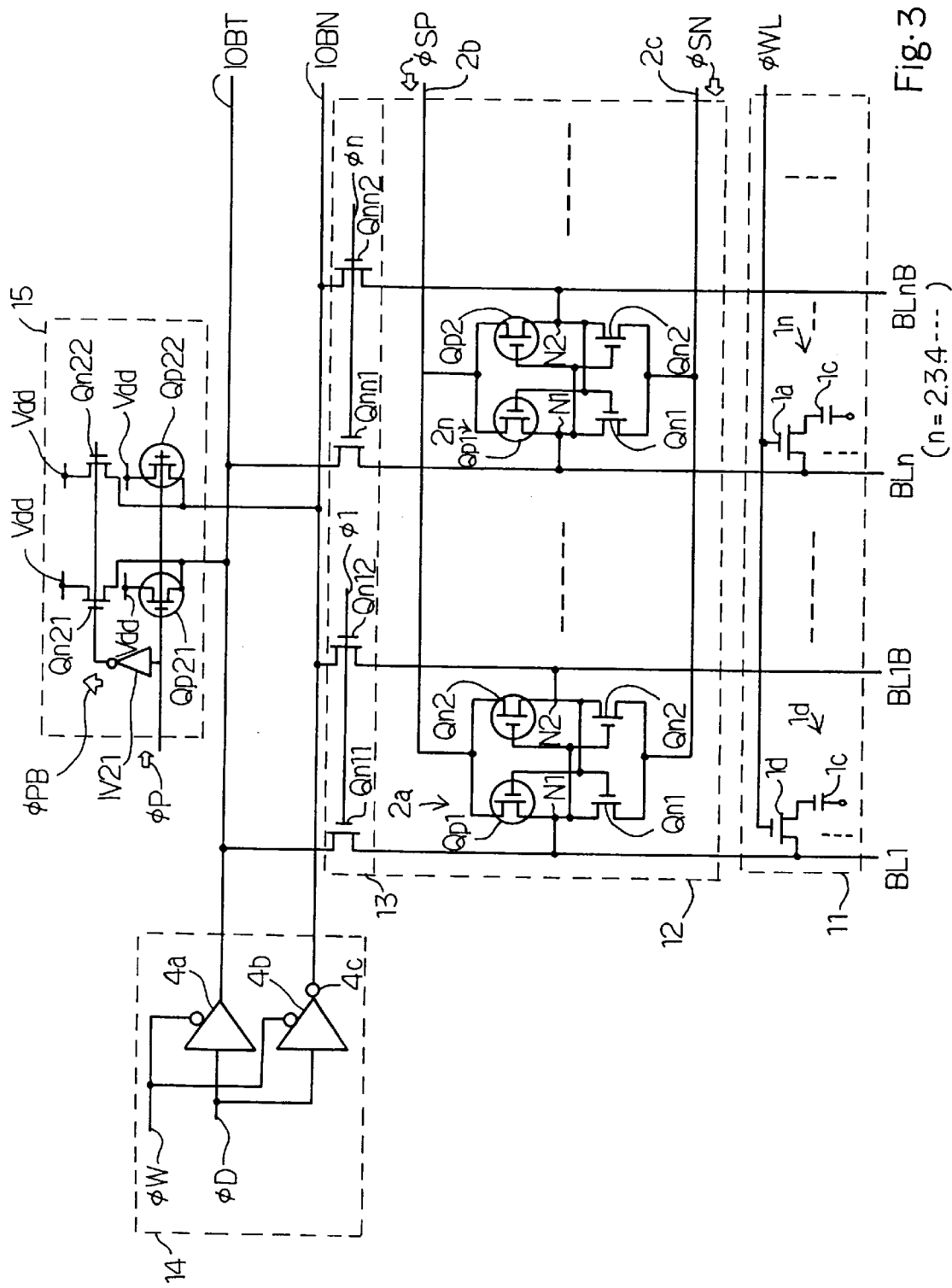
FIG. 3 is a circuit diagram showing the arrangement of a semiconductor synchronous dynamic random access memory device according to the present invention.

Referring to FIG. 3 of the drawings, a semiconductor synchronous dynamic random access memory device embodying the present invention largely comprises a memory cell array 11, a sense amplifier unit 12, a column selector 13, a write control circuit 14 and a precharge circuit 15. The memory cell array 11, the sense amplifier unit 12, the column selector 13 and the write control circuit 14 are similar in circuit arrangement to the memory cell array 1, the sense amplifier unit 2, the selector 3 and the write control circuit 4, respectively. For this reason, circuit components are labeled with the same references designating corresponding circuit components of the prior art semi-conductor synchronous dynamic random access memory device without detailed description. The bit line pairs and the data bus lines are also labeled with the same references as those of the prior art semiconductor synchronous dynamic random access memory device.

The precharge circuit 15 includes a pair of p-channel enhancement type field effect transistors Qp21/Qp22 connected between the positive power supply line Vdd and the data bus lines IOBT/IOBN as similar to the prior art precharge circuit 5. The precharge circuit 15 further includes a pair of n-channel enhancement type field effect transistors Qn21/Qn22 connected between the positive power supply line Vdd and the data bus lines IOBT/IOBN and an inverter IV21 for producing a complementary precharge control signal ΦPB. When the precharge control signal ΦP is supplied to the gate electrodes of the p-channel enhancement type field effect transistors Qp21/Qp22 and the inverter IV21, the p-channel enhancement type field effect transistors Qp21/Qp22 turn on, and the inverter IV21 causes the n-channel enhancement type field effect transistors Qn21/Qn22 to turn on with the complementary precharge control signal ΦPB. The n-channel enhancement type field effect transistors Qn21/Qn22 charge the data bus lines IOBT/IOBN to certain potential level lower than the positive power voltage level Vdd by the threshold thereof.

In this instance, the n-channel enhancement type field effect transistor Qn22 is equal in current driving capability to the plural n-channel enhancement type field effect transistors Qn2 of the differential amplifiers 2n, and the p-channel enhancement type field effect transistor Qp22 is equal in current driving capability to the single n-channel enhancement type field effect transistor Qn2 of the differential amplifier 2a. Similarly, the n-channel enhancement type field effect transistor Qn21 is equal in current driving capability to the plural n-channel enhancement type field effect transistors Qn1 of the differential amplifiers 2n, and the p-channel enhancement type field effect transistor Qp21 is equal in current driving capability to the single n-channel enhancement type field effect transistor Qn1 of the differential amplifier 2a.

Figure 4:
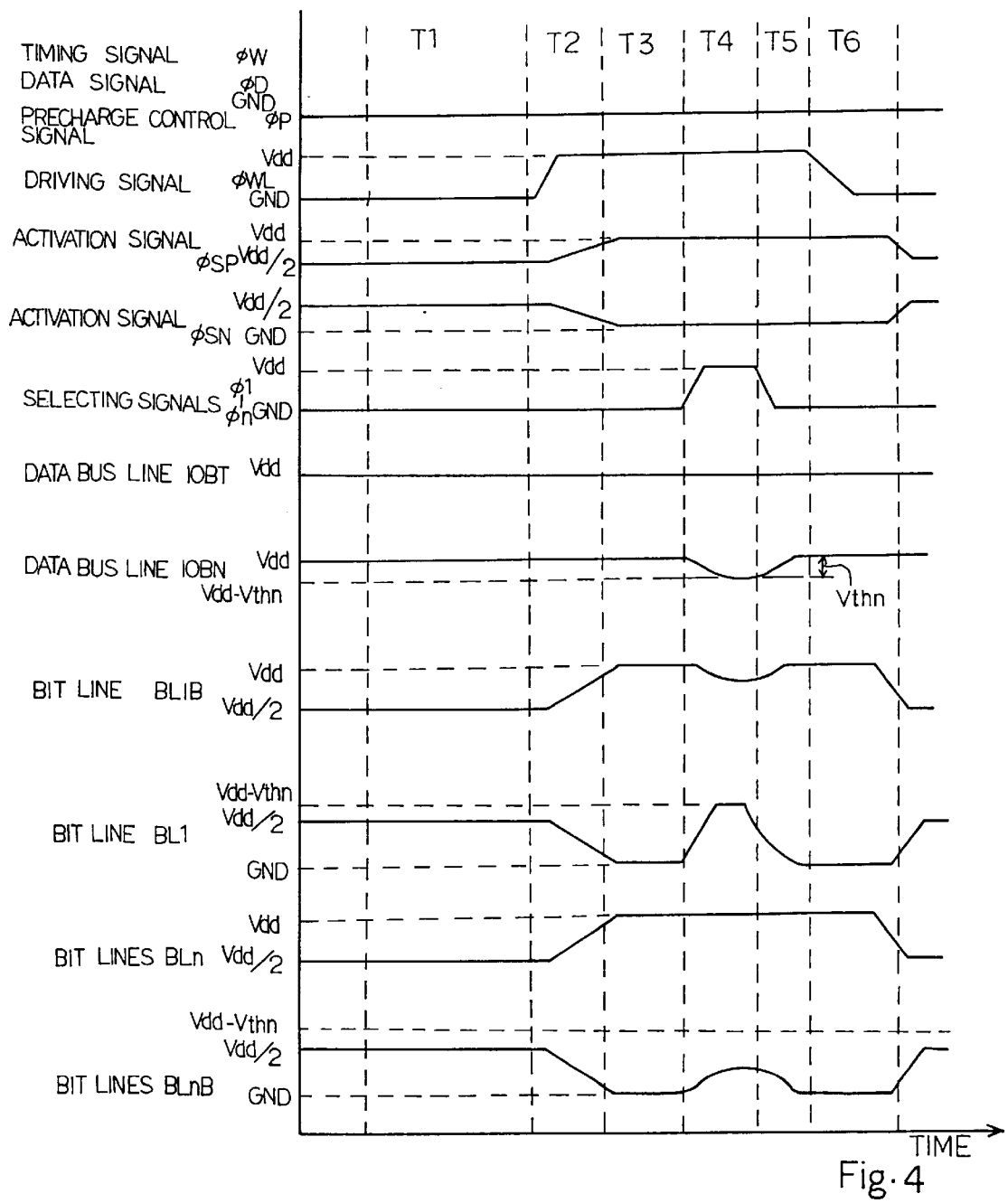
FIG. 4 is a timing chart showing the input/output masking function of the semiconductor synchronous dynamic random access memory device in the block right mode.

The semiconductor synchronous dynamic random access memory device achieves the input/output masking function as follows. FIG. 4 illustrates the input/output masking function in the block write mode. In FIG. 4, "Vdd" and "GND" also mean the power voltage level and the ground level, respectively, and "BLn/BLnB", "2n" and "Qnn1/Qnn2" are assumed to represent plural bit line pairs, plural differential amplifiers and plural pairs of n-channel enhancement type field effect transistors, respectively.

The activation signals ΦSP/ΦSN, the bit line pairs BL1/BL1B to BLn1/BLnB are equalized at Vdd/2 in T1, and the precharge control signal ΦP of the ground level causes the p-channel enhancement type field effect transistors Qp21/Qp22 to charge the data bus lines IOBT/IOBN to Vdd. The timing signal ΦW, the data signal ΦD and the driving signal ΦWL are maintained at the ground level.

When the data read-out proceeds from T1 to T2, the driving signal ΦWL is changed to Vdd, and causes the n-channel enhancement type field effect transistors 1d of the associated memory cells 1a to 1n to turn on. Then, the associated storage capacitors 1c are connected to the bit line BL1 and the bit lines BLn, and potential differences take place on the bit line pair BL1/BL1B and the bit line pairs BLn/BLnB.

The activation signal ΦP and the activation signal ΦSN are separated from Vdd/2 to Vdd and GND, and activate the differential amplifier 2a and the differential amplifiers 2n. The differential amplifier 2a and the differential amplifiers 2n increase the potential difference on the bit line pair BL1/BL1B and the potential differences on the bit line pairs BLn/BLnB.

The differential amplification is completed in T3. The bit line BL1 and the bit line BL1B reach GND and Vdd, respectively. On the other hand, the bit lines BLn and the bit lines BLnB reach Vdd and GND, respectively. Thus, the potential difference on the bit line pair BL1/BL1B is opposite in polarity to the potential differences on the bit line pairs BLn/BLnB.

In order to achieve the input/output masking function, the timing signal ΦW and the precharge control signal ΦP are maintained at the ground level. The p-channel enhancement type field effect transistors Qp21/Qp22 pulls up the data bus lines IOBT/IOBN to the positive power voltage level Vdd, and prevents the memory cells 1a to 1n from the current flowing out from the differential amplifiers 2a to 2n.

When the data read-out proceeds to T4, all the selecting signals Φ1 to Φn are changed to Vdd. GND on the bit lines BL1 and BLnB allow the n-channel enhancement type field effect transistor Qn11 and the n-channel enhancement type field effect transistors Qnn2 to turn on. Although the p-channel enhancement type field effect transistor Qp4 supplies Vdd to the data bus line IOBN, the plural n-channel enhancement type field effect transistors Qn2 of the differential amplifiers 2n try to pull down the data bus line IOBN to GND. However, the n-channel enhancement type field effect transistors Qn2 of the plural differential amplifiers 2n are equal in current driving capability to the n-channel enhancement type Field effect transistor Qn22. For this reason, the data bus line IOBN is regulated to the certain level lower than the positive power voltage level Vdd by the threshold Vthn of the n-channel enhancement type field effect transistor Qnn2.

The potential level (Vdd−Vthn) on the data bus line IOBN allows the n-channel enhancement type field effect transistor Qn12 to turn on. However, the p-channel enhancement type field effect transistor Qp2 ofthe single differential amplifier 2a supplies the current to the bit line BL1B, and the bit line BL1B is charged to a potential level between Vdd and the certain potential level (Vdd−Vthn).

The selecting signal 101 1 causes the n-channel enhancement type field effect transistor Qn11 to turn on. Although the n-channel enhancement type field effect transistor Qn1 of the single differential amplifier 2a discharges the current, the n-channel enhancement type field effect transistor Qn21, the p-channel enhancement type field effect transistor Qp21 and the p-channel enhancement type field effect transistors Qp1 of the plural differential amplifiers 2n pull up the bit line BL1 toward the positive power voltage level Vdd. When the potential level on the bit line BL1 reaches the certain level (Vdd−Vthn), the n-channel enhancement type field effect transistor Qn11 turns off, and the bit line BL1 is maintained at the certain level (Vdd−Vthn).

The data bus lines BLn are maintained at Vdd, because the p-channel enhancement type field effect transistors Qp1 of the differential amplifiers 2n supply current thereto. The positive power level Vdd on the bit lines BLn cause the n-channel enhancement type field effect transistors Qnn1 to turn off.

The n-channel enhancement type field effect transistors Qn2 of the plural differential amplifiers 2n are balanced with the n-channel enhancement type field effect transistor Qn22, and the p-channel enhancement type field effect transistor Qp22 charges the bit lines BLnB toward the certain level (Vdd−Vthn). The bit lines BLnB are balanced below (Vdd−Vthn).

When the data read-out proceeds to T5, the selecting signals Φ1 to Φn are changed to GND, and the n-channel enhancement type field effect transistors Qn11/Qn12 to Qnn1/Qnn2 turn off. The p-channel enhancement type field effect transistors Qp21/Qp22 charge the data bus lines IOBT/IOBN to Vdd. The bit line BL1/BL1B and the bit line pairs BLn/BLnB are recovered to the initial potential differences. Thus, small potential differences are left on the bit line pairs BL1/BL1B to BLn/BLnB, respectively.

When the data read-out proceeds to T6, the driving signal ΦWL is changed to the low level, and the n-channel enhancement type field effect transistors 1d turn off. Thus, even though all the n-channel enhancement type field effect transistors Qn11/Qn12 to Qnn1/Qnn2 are turned on, the precharge circuit 5 pulls the data bus lines IOBT/IOBN to Vdd, and the differential amplifiers 2a to 2n increases the small potential differences. As a result, the original data bits are restored in the memory cells 1a to 1n. Thus, the input/output masking function does not destroy the data bits stored in the memory cells 1a to 1n.

As will be appreciated from the foregoing description, the precharge circuit 15 has not only the p-channel enhancement type field effect transistors Qp21/Qp22 but also the n-channel enhancement type field effect transistors Qn21/Qn22, and the n-channel enhancement type field effect transistors Qn21/Qn22 prevent the data bus lines IOBN/IOBT from the potential delay under the certain potential level (Vdd−Vthn) in the input/output masking function. The limit does not allow the data line pair to invert the potential difference on the bit line pair, and the data bits stored in the memory cells are not destroyed.

Although a particular embodiment of the present invention has been shown and described, it will be obvious to those skilled in the art that various changes and modifications may be made without departing from the spirit and scope of the present invention.

The n-channel enhancement type field effect transistor Qn21/Qn22 may be larger in current driving capability than the n-channel enhancement type field effect transistors Qn2 of the plural differential amplifiers 2n.

What is claimed is:

1. A semiconductor memory device comprising a plurality of memory cells for storing data bits, a plurality of bit line pairs selectively connected to said plurality of memory cells and propagating potential differences representative of said data bits from said plurality of memory cells, a plurality of differential amplifiers connected between a first power voltage line and a second power voltage line different in potential level from said first power voltage line and activated for increasing the magnitude of said potential differences on said plurality of bit line pairs, a data line pair, a selector connected between said plurality of bit line pairs and said data line pair and responsive to selecting signals for concurrently connecting said plurality of bit line pairs to said data line pair in a masking function, and a precharge circuit connected to said data line pair and including
 first charging transistors connected between a third power voltage line and the data lines of said data line pair and responsive to a precharge control signal so as to form first conductive channels of one conductivity type for charging said data lines to a power voltage on said third power voltage line, and
 second charging transistors connected between said third power voltage line and said data lines and responsive to a complementary signal of said precharge control signal so as to form second conductive channels of the opposite conductivity type for charging said data lines to a certain level lower than said third power voltage line by a threshold of said second charging transistors.

2. The semiconductor memory device as set forth in claim 1, in which each of said second charging transistors is larger in current driving capability than each of said first charging transistors so that said data lines are selectively decayed to said certain level during said masking function.

3. The semiconductor memory device as set forth in claim 1, in which said plurality of differential amplifiers have first discharging transistors respectively connected to first bit lines of said plurality of bit line pairs and second discharging transistors respectively connected to second bit lines of said plurality of bit line pairs, and each of said second charging transistors is equal to or greater in current driving capability than selected ones of said first discharging transistors or selected ones of said second discharging transistors concurrently discharging current from the associated first bit lines or the associated second bit lines.

4. The semiconductor memory device as set forth in claim 1, in which said first charging transistors are p-channel enhancement type field effect transistors, and said second charging transistors are n-channel enhancement type field effect transistors.

5. The semiconductor memory device as set forth in claim 1, in which each of said plurality of memory cells is implemented by a series combination of a switching transistor and a storage capacitor.

* * * * *